United States Patent
Yuan (12)

(10) Patent No.: US 6,627,507 B2
(45) Date of Patent: Sep. 30, 2003

(54) INTEGRATED CIRCUIT AND METHOD OF USING POROUS SILICON TO ACHIEVE COMPONENT ISOLATION IN RADIO FREQUENCY APPLICATIONS

(75) Inventor: Han-Tzong Yuan, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 169 days.

(21) Appl. No.: 09/740,884

(22) Filed: Dec. 21, 2000

(65) Prior Publication Data

US 2001/0023111 A1 Sep. 20, 2001

Related U.S. Application Data

(62) Division of application No. 09/215,700, filed on Dec. 18, 1998, now Pat. No. 6,407,441.
(60) Provisional application No. 60/068,922, filed on Dec. 29, 1997.

(51) Int. Cl.[7] .............................................. H01L 21/20
(52) U.S. Cl. ..................... 438/379; 438/381; 257/531
(58) Field of Search ................................. 438/381, 426, 438/379; 257/339

(56) References Cited

U.S. PATENT DOCUMENTS

| | | | | |
|---|---|---|---|---|
| 5,548,150 A | * | 8/1996 | Omura et al. ................ 257/339 |
| 5,736,749 A | * | 4/1998 | Xie ............................... 257/3 |
| 5,773,353 A | * | 6/1998 | Kwon et al. ................. 438/426 |
| 6,013,933 A | * | 1/2000 | Foerstner et al. ............ 257/415 |
| 6,021,675 A | * | 2/2000 | Seefeldt et al. ................ 73/721 |
| 6,153,489 A | * | 11/2000 | Park et al. .................... 438/381 |
| 6,376,859 B1 | * | 4/2002 | Swanson et al. ............... 257/49 |
| 6,407,441 B1 | * | 6/2002 | Yuan ........................... 257/531 |
| 6,452,249 B1 | * | 9/2002 | Maeda et al. ................ 257/531 |

OTHER PUBLICATIONS

Nam et al., "High–Perfromance Planar Inductor on Thick Oxidized Porous Silicon (OPS) Substrate" Ayg. 1997, IEEE Microwave and Guided Wave Letters, vol. 7, No. 8, pp 236–238.*

Nam et al., "High–Perfromance Planar Inductor on Thick Oxidized Porous Silicon (OPS) Substrate" Ayg. 1997, IEEE Microwave and Guided Wave Letters, vol. 7, No. 8, pp 236–238.*

* cited by examiner

*Primary Examiner*—William David Coleman
(74) *Attorney, Agent, or Firm*—Jacqueline J. Garner; Wade James Brady III; Frederick J. Telecky, Jr.

(57) ABSTRACT

The invention relates to an improved substrate (100) using a layer (112) or region (130) of porous silicon that is created in the bulk silicon substrate material (110) to increase the resistivity of the substrate (100) thus making it suitable for passive component integration directly on the motherboard (200) or chip (230) and useful for high frequency applications due to its low loss, low dielectric properties. One or more passive components such as inductors (214), resistors (212) and capacitors (216) can be integrated on the device (140) over the porous silicon region (130). The high resistivity of the device makes it ideal for integration on a single platform using conventional wafer fab processes since loss at radio frequencies is comparably less when compared to a pure silicon substrate.

12 Claims, 3 Drawing Sheets

INTEGRATED CIRCUIT AND METHOD OF USING POROUS SILICON TO ACHIEVE COMPONENT ISOLATION IN RADIO FREQUENCY APPLICATIONS

CROSS REFERENCE TO PRIOR APPLICATIONS

This application is a division of U.S. Ser. No. 09/215,700, filed Dec. 18, 1998 now U.S. Pat. No. 6,407,441 which claims priority based upon Provisional Application Serial No. 60/068,922, filed Dec. 29, 1997.

TECHNICAL FIELD

The present invention relates in general to improved integrated circuit devices and more particularly to an improved integrated circuit which provide low-loss and low-crosstalk passive component integration and is suitable for Radio Frequency Integrated Circuits (RFICs) applications.

BACKGROUND OF THE INVENTION

The background is described in connection with an improved substrate suitable for RFIC applications. It should be understood, however, that the principles disclosed may apply to a wider array of applications where substrate-related losses are a concern.

Inductors are essential elements of Radio Frequency (RF) circuits. They are needed for inter-stage impedance matching, filtering, and decoupling of AC/DC signals. Impedance matching plays a critical role in RF circuit design. For example, low noise amplifiers using MOSFETs normally need inductively tuned inputs to lower the input impedance and improve the receiver noise figure. Inductors are commonly used in both the input and output of RF power amplifiers to improve the power gain and power added efficiency. Impedance matching would be more effective if inductors were brought closer to the active devices, motivating development of on-chip matching for RF integrated circuits.

Several forms of inductors are used with RF circuits. Air coil inductors are commonly used at operating frequencies of less that 1 GHz. Although air coil inductors are simple to design and fabricate, their three-dimensional structure makes them unsuitable for integration on either semiconductor chips or fiber-glass circuit boards. Moreover, air coil inductors must be assembled in conjunction with other packaged components on a circuit board.

Transmission line inductors become practical in size above 10 GHz. Their simple structure makes them readily integratable on glass fiber circuit boards or semiconductor substrates if the latter also have high resistivity greater than 1000 ohm-cm.

Cellular phones and wireless LANs operating in the 1 to 6 GHz range have created new challenges for inductor design. Neither aircoil nor transmission line inductors are suitable for cellular phone applications because of their large size. Spiral inductors have now become a focus for technology development due to their small size and their two-dimensional design which is compatible to 1 to 6 GHz on-chip integration.

At the same time, the advance of submicron CMOS has prompted the use of BICMOS and CMOS for RFIC design. In such applications, however, low substrate resistivity which played an insignificant role in digital circuits presents major problems for RFIC designers. For example, spiral inductors integrated directly on the BICMOS or CMOS substrates normally showed low Q because the inductors must absorb substantial substrate losses.

As a result various silicon substrate technologies have been examined to solve this problem. Table 1 below lists the prior art silicon substrate technologies which have been explored to date.

TABLE 1

Prior Art Substrate Technologies

| Technique | Sources | Comments |
| --- | --- | --- |
| High-R Silicon | Westinghouse Motorola | Unconventional IC Substrates |
| Glass refill | M-COM | Limited to passive components |
| Silicon on sapphire | Peregrine | Not mainstream processes |
| Polyimide coating | Hughes Samsung | Require > 10 µm thick polyimide |
| Air isolation | UCLA | Not compatible to IC processes |
| Multi-level metal | IBM, National TI | Does not address substrate loss |

Among these silicon substrate technologies, other than the IBM multi-level metal inductor approach, none of them can be adopted for main line silicon wafer fab facility. Furthermore, the IBM approach addresses the inductor metal loss but not the substrate loss, making it unsuitable for RFIC designs.

Porous Silicon is well known to those of skill in the art as a material with high resistivity and performance characteristics close to GaAs. The development of porous silicon, however, has been largely limited to silicon light emitting diodes. It was also tried for device isolation in which the porous silicon was used as an intermediate process step to create buried oxide layers.

Porous silicon is formed by anodization of silicon producing an interconnected sub-100 Å pore structure within a single crystal silicon matrix. The process is quite rapid. For example, a 100 µm layer can be formed within 15 minutes on wafers of any diameter. Masks can be used to limit the formation of porous silicon to selected areas of the wafer. It is even possible to grow relatively high quality epitaxial silicon over porous silicon. Prior art processes for the development and formation of porous silicon are plentiful and include: I. J. Beale, et al., "An experimental and Theoretical Study of the Formation and Microstructure of Porous Silicon," J. Crystal Growth 73 (1985) 622–636; A. G. Nassiopoulos, et al., "Sub-Micrometer Luminescent Porous Silicon Structures Using Lithographically Patterned Substrates," Thin Solid Films, vol. 255 (1995), 329; M. Lee, et al., "Utilization of GaAs Masking Layers for Formation of Patterned Porous Silicon," Jpn. J. Appl. Phys., vol. 35 (1996), 3116.

Silicon RFICs in either monolithic integration forms or silicon-on-silicon multichip modules have been developed to improve the footprint, cost, and performance of a cellular phone design. Their application to cellular phones were hampered, until the present invention, by RF isolation passive component integration problems and RF/DC grounding problems. Other developments have shown that high-Q inductors can be fabricated on greater than 1000 ohm-cm silicon substrates. In the meantime, power amplifiers using less than 0.01 ohm-cm p+ substrate grounded design have showed good performance in the 1–2 GHz range. The invention provides a method to create both high resistivity and low resistivity materials on the same silicon wafer, thus solving the RF isolation and RF/DC grounding problems that has hampered RFIC development.

SUMMARY OF THE INVENTION

The invention provides the reduction of silicon substrate losses by the insertion of a thick (100 μm) high resistivity (>1000 ohm-cm) porous silicon layer between passive components such as inductors and the bulk silicon wafer. Porous silicon exhibits high resistivity greater than 1000 ohm-cm and, as such, its use is ideal when integrated with low resistivity silicon for good isolation of passive RF components. A low resistivity silicon motherboard using locally defined porous silicon can provide a via free DC/RF grounding platform eliminating some of the high costs processes associated with prior art motherboard designs. An advantage of using porous silicon in the substrate is increased RFIC performance approaching that of GaAs integrated circuits.

Another advantage is that due to its thick high resistivity layer, the porous silicon motherboard of the present invention permits the integration of all passive RF components on a single chip.

Still another advantage is increased production yield as the silicon IC components can be assembled on the motherboard directly without the concerns of thermal expansion differences.

Disclosed in one embodiment is an improved integrated circuit platform with low-loss and low-crosstalk characteristics which permits the integration of RF passive components such as inductors, capacitors and resistors. Selective regions of porous silicon are created on a layer of silicon substrate. Later, AC/DC terminals can be added to the substrate to create a fully functional platform. Compared to prior art fiber glass or ceramic circuit boards, the integrated circuit platform of the present invention is smaller in size and low in manufacturing costs since it shares the same silicon wafer fabrication facility.

In another embodiment, a porous silicon layer of created over a silicon substrate for formation of an RF CMOS chip where a thick layer of locally placed porous silicon is formed after all active CMOS devices are fabricated. This enables low temperature fabrication of RF isolated passive components in a conventional CMOS fabrication line.

Other aspects and advantages of the invention including its specific implementations are understood by those skilled in the art by reference to following detailed description taken in conjunction with the accompanying drawings.

BRIEF DESCRIPTION OF THE DRAWINGS

In the drawings:

FIG. 1b is a cross-sectional view of the spiral inductor shown in FIG. 1a;

Corresponding numerals in the figures refer to corresponding parts unless otherwise indicated.

DETAILED DESCRIPTION OF THE PREFERRED EMBODIMENTS

Figure 1A:
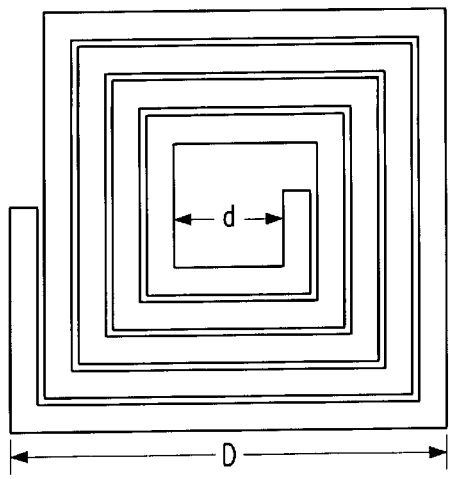
FIG. 1a is a plan view of a typical turn square spiral inductor fabricated on a silicon substrate according to prior art methods.
Figure 1B:
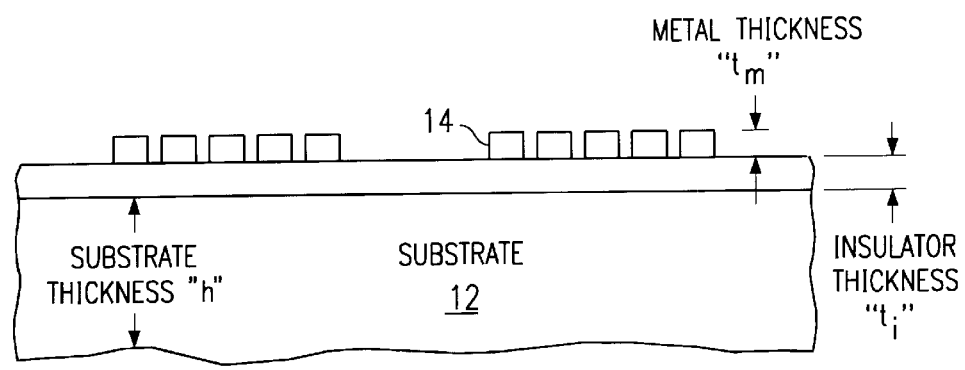

FIGS. 1a and 1b show the plan view and the cross-section views, respectively, of a typical 4.5 turn square spiral inductor 10 fabricated on a silicon substrate 12. The key design parameters of the spiral inductor 10 are the inductor value L and Q-factor. In the absence of magnetic materials, the value L of a square spiral inductor 10 is largely determined by the number of turns "N", the outermost dimension "D", and the innermost dimension "d" and fits the empirical expression in Equation 1 (below) in which a, r, and b are the fitting constants for a particular inductor design, metal, and substrate material.

$$L = aN^r \ln[b(D+d/D-d)] \qquad \text{Equation 1.}$$

As is known to those of ordinary skill, the inductor losses are often related to the Q-factor of the inductor 10. The Q-factor of the spiral inductor 10, in turn, consists of two components, $1/Q = 1/Q_{res} + 1/Q_{sub}$, in which $Q_{res}$ accounts for metal loss and $Q_{sub}$ accounts for substrate loss. Also, the metal loss at RF frequencies is caused by skin resistance, which is a function of the conductivity of the metal layer 14 and skin depth (ti) at the operating frequency. To minimize metal loss, it is desirable to use a high conductivity film having a thickness (tm) more than three times that of the skin depth (ti). For example, if copper is used, the spiral inductor metal thickness (tm) is about 7 μm at 1 GHz operation and about 5 μm at 2 GHz operation.

In addition, total inductor losses vary with substrate resistivity, due to the deep penetration of magnetic field. If the spiral inductor 10 is fabricated on high resistivity silicon (>kohm-cm) the inductor 10 will induce a small current in the substrate and hence will have a small substrate loss compared to those losses experienced with metal. On the other hand, the Q of the spiral inductor 10 can be dominated by the substrate loss if low resistivity silicon (<10 ohm-cm) allows high induced current to flow. Between these two extremes, the substrate loss is affected by a complex set of factors, including substrate skin effect and $SiO_2/Si$ interfacial polarization loss and others as is appreciated by those skilled in the art.

Thus, substrate-related inductor coupling losses will typically limit the Q of the inductor 10 if the silicon layer 12 is of a low resistivity (<10 ohm-cm) silicon. The invention provides the reduction of coupling losses by the conversion of a relatively thick (100 μm) low resistivity silicon into high resistivity ($10^5$ ohm/cm) porous silicon layer or region permitting passive components such as high-Q inductors, high-Q capacitors and resistors to be attached directly to the bulk silicon wafer.

Figure 2:
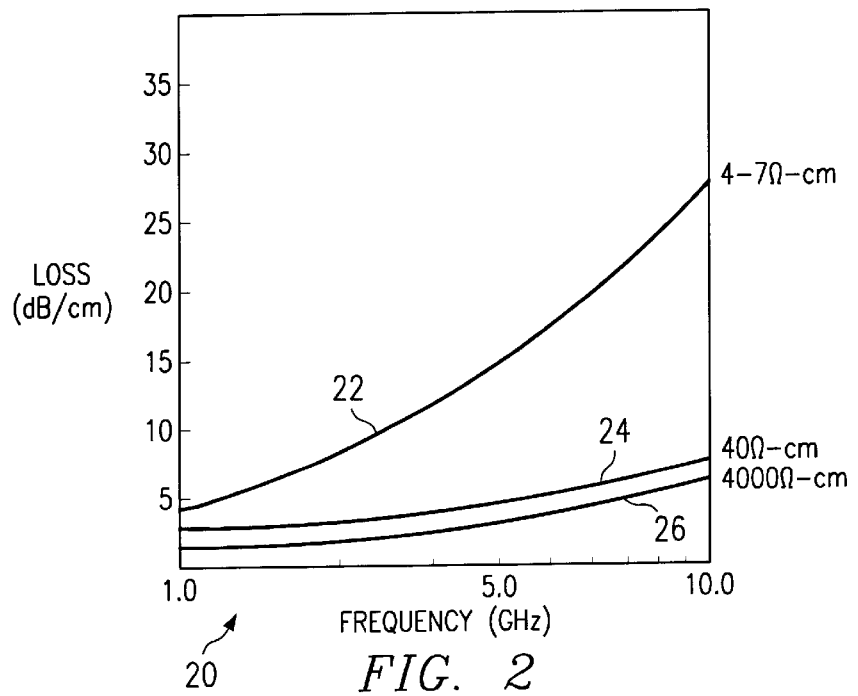
FIG. 2 is a chart showing the RF loss vs. frequency determined using coplanar transmission lines fabricated on silicon substrates of various resistivity.

In FIG. 2, a graph 20 of the loss as a function of frequency is shown. Curve 22 is shown exponentially increasing as a function of higher frequencies for a low resistivity substrate (4–7 ohm-cm). On the other hand, curves 24 and 26 correspond to substrate layers having 40 ohm-cm and 4000 ohm-cm, respectively. As shown, the loss as a function of frequency is substantially reduced as the resistivity of the substrate material increases even to 40 ohm-cm. The results of graph 20 can be obtained using a set of coplanar transmission lines (see FIG. 4) fabricated on silicon substrates of various resistivity values. Note, at 2 GHz the low resistivity silicon substrate 22 adds nearly 6 dB/cm loss as compared to the transmission loss on high resistivity silicon.

Figure 3:
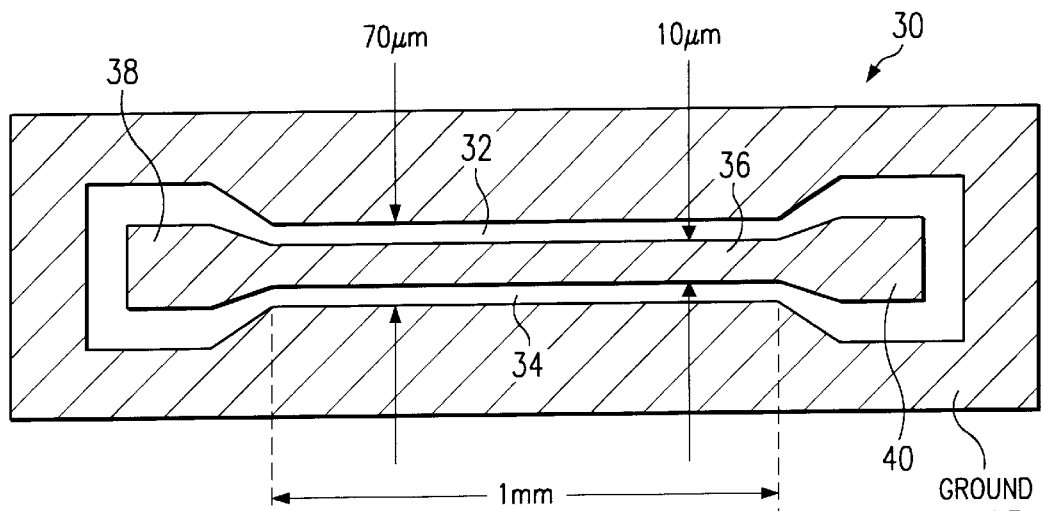
FIG. 3 shows a transmission line structure utilized to characterize various substrates.

In general, the Q-factor performance of the spiral inductor 10 is effected dramatically by the substrate material at RF frequencies while the inductor value L will stay almost constant from low to RF frequencies. This principle is tested by FIG. 3 which depicts a CoPlanar Waveguide (CPW) transmission line 30 structure fabricated on a substrate material 32. The substrate material 32 can vary and a high frequency signal is transmitted from one end 38 to a second end 40 of the transmission line 30.

The transmission line 30 essentially forms a single line inductor 36 carrying current from one location end 38 to another 40 with a phase delay between the input 38 and output 40. Most losses in the transmission line 30 are due to reflection and attenuation of the signal as it propagates throughout the line 36. Thus, when an incident signal or voltage approaches the transmission line 30, a portion of the signal may be reflected due to a mismatch of the source impedance and the transmission line characteristic impedance. As the remainder of the signal propagates down the line 36, its power is attenuated due to the finite conductivity of the metal conductors and the dielectric loss of the substrate material 32.

At the output end 40 of the transmission line 30, the signal may see another mismatch with the load impedance resulting in a multiple reflection problem. By choosing impedance values to eliminate reflections, the line 36 loss can be directly determined by the difference in power between the input 38 and output 40.

The transmission line 30 can be used to compare line losses on a variety of substrates. For this purpose and in one embodiment, a three metal strip structure configuration is used composed of a signal strip with a ground strip on either side all supported on a substrate. The two ground strips are tied together at the ends to suppress odd coplanar modes. Therefore, only the desirable even (symmetric) mode is supported on this structure.

Signal frequencies can be set at both 1 and 6 GHz. Table 2 below demonstrates that the loss for p+ silicon substrate is much higher than for Semi-Insulating (SI) GaAs (SI-GaAs). The loss, however, for 44 μm thick porous silicon-over-p+ Si is comparable to that for SI-GaAs. Thus, porous silicon was verified to reduce RF coupling losses into microwave frequencies. A semi-insulating GaAs (SI-GaAs), p+ Si, and porous p+ SI, each coated with a 1500° A CVD $SiO_2$ layer can be used to achieve these results. Four micron thick plated gold can be used for the conductors.

To obtain the loss measurements as per the present invention, the transmission line measurements can be performed using a network analyzer or any instrument capable of measuring magnitude and phase of reflected and transmitted signals. By use of the same transmission line structure on a variety of substrates, dielectric losses constitute all the variation in the total loss. The loss of the lines on differing substrates is shown in Table 2 as follows:

TABLE 2

Dielectric losses on various substrates

|  | SI-GaAs | p + SI | Porous SI |
| --- | --- | --- | --- |
| Loss @ 1 GHz | 0.2 dB/cm | 6.0 dB/cm | 0.2 dB/cm |
| Loss @ 6 GHz | 0.8 dB/cm | 20 dB/cm | 1.0 dB/cm |

Thus, a p+silicon substrate layer exhibits much greater loss than the SI-GaAs. On the other hand, the porous silicon over p+silicon has nearly the same low loss characteristics as the SI-GaAs demonstrating that the benefits of using porous silicon layers to achieve low inductor loss on a p+ Si substrate. The advantages of using porous silicon, as per the present invention, include decreases costs (porous silicon is less expensive than GaAs), film uniformity and good high-temperature stability.

Figure 4:
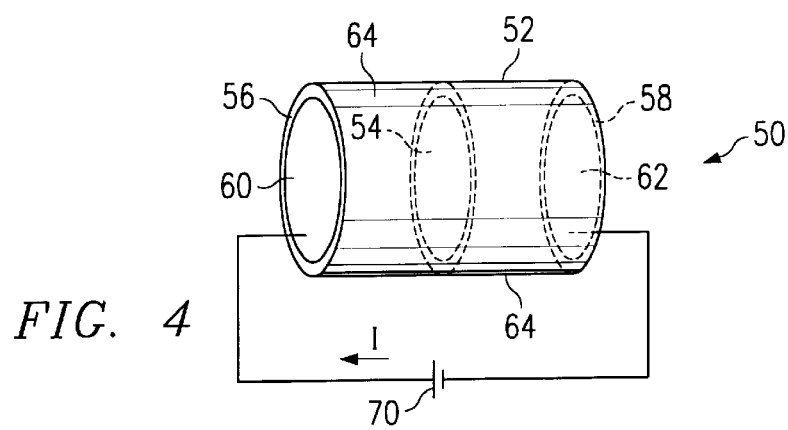
FIG. 4 is schematic diagram of a anodization cell for forming porous silicon layers.

In FIG. 4, a schematic diagram of an anodization cell useful in forming a porous silicon layer is shown and denoted generally as 50. The anodization cell 50 includes a chamber 52 with a silicon wafer 54 separating front 56 and rear 58 halves of the cell 50. Each half 56, 58 has a platinum electrode 60 and 62, respectively, which form input and output terminals of the cell 50. A pumped supply of electrolyte 64, such as an HF-ethanol-$H_2O$ solution, occupies the space between the wafer 54 and the electrodes 60, 62. A power source 70 forms a complete circuit in parallel with the cell 50 and provides a current source 72 to the structure via the electrodes 60, 62.

A porous silicon film forms on the anode side of the wafer since the silicon is cathodic on the rear half and does not react. The most important variables affecting the formation of the porous silicon wafer 54 are: 1) the substrate doping type and level; 2) the concentration of the electrolyte 64; and 3) the current density 72. Preferably, the HF concentration is maintained between 10–48 percent (%) with a current density between 1–100 mA/$cm^2$.

For fixed substrate resistivity, similar film porosity can be produced using various combinations of the electrolyte concentration and the current density 72. Porosity of the wafer 54 Generally increases with increasing current density 72 and decreasing concentration of the electrolyte 64. As is appreciated by those of ordinary skill, the porous silicon wafer 54 has a high internal surface area with many impurities (such as oxygen, carbon, fluorine and hydrogen). These impurities should not present a significant problem for subsequent front-end or tail-end processing.

Figure 5A:
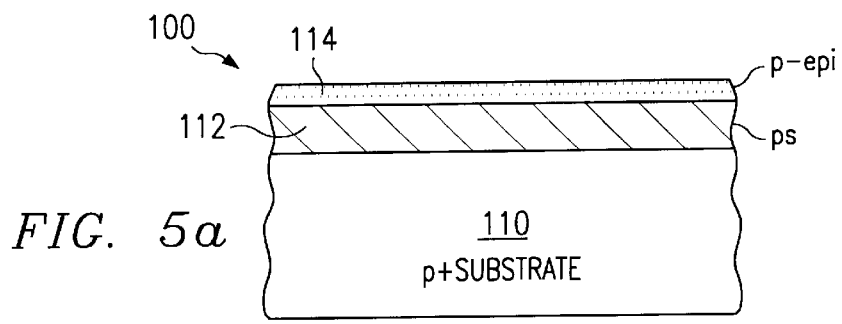
FIGS. 5a and 5b are cross sectional views of substrates using porous silicon according to the invention.

As such, a number of RF Integrated Circuit (RFIC) applications are within the scope of the present invention. Turning first to FIG. 5a, a full silicon on porous silicon substrate structure is shown and denoted generally as 100. Using conventional CMOS processes, a p+substrate layer 110 is the starting point. The p+substrate layer 110 is anodized to create a thick porous silicon layer 112. Preferably, the porous silicon layer is between 50 and 100 μm thick. Next, a p-epitaxial layer 114 is grown using conventional methods on the porous silicon layer 112. Preferably the p-epitaxial layer is between 1 to 2 μm thick.

Figure 5B:
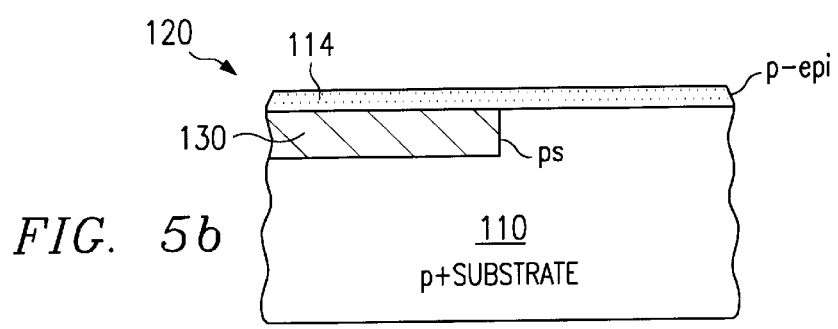

Since the resulting structure 100 is very similar to conventional advanced CMOS, it is suitable for processing in a conventional CMOS wafer fab with little process modification. In FIG. 5b, a silicon on partial porous silicon substrate structure is shown and denoted generally as 120. As shown, instead of a complete layer of porous silicon 112, only a region 130 of the substrate 114 is anodized. The region 130 is designated for passive component integration and, as such, is anodized at specific locations on the substrate material 110. The advantages of structure 130 is that it permits the growth of a high quality epitaxial layer over the bulk silicon substrate, while low quality epitaxial layer can be used on the porous silicon simply for passive component integration. Like the full porous silicon structure 100 of FIG. 5a, the partial porous silicon structure 120 can be processed using conventional CMOS methods in a wafer fab with little modification.

Figure 6:
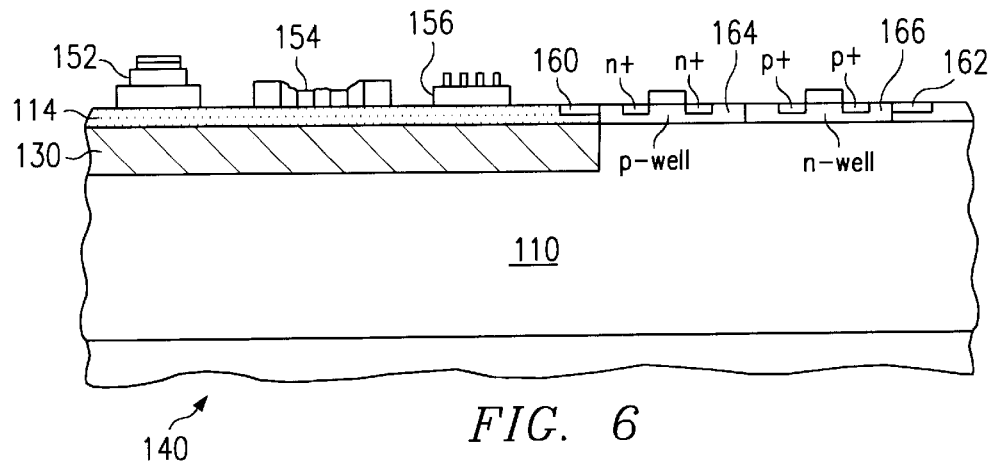
FIG. 6 is a cross sectional view of an integrated circuit chip with on-chip passive component according to one embodiment.

In FIG. 6, a device with integrated passive components using the partial porous silicon structure 120 is shown and denoted generally as 140. The bulk silicon substrate 110 has a porous silicon region 130 created in it using standard processes. In one embodiment, the resistivity of the substrate is on the order of 0.01 ohm-cm while the porous silicon region 130 has significantly greater resistivity on the order of 10 kohm-cm or greater.

As shown, a plurality of passive components have been fabricated on the portion of the epitaxial layer 114 directly overlying the porous silicon region 130. For example, as shown, a Hi-Q capacitor 152, spiral inductor 154 and interconnect/transmission lines 156 are all located directly above the porous silicon region 130 with an interspersed epitaxial layer 114 therein. In this configuration, the region 130 exhibits high resistivity to signals propagating through the passive components thus limiting coupling losses in the substrate 110.

On the digital side of the device 140, regions 160 and 162 are formed, preferable with shallow trench isolation methods, to further isolate the passive devices 152, 154, 156 from other formations on the device 140. The formation of p-well regions 164 and n-well region 166 are accomplished by techniques well known to those of ordinary skill.

Figure 7A:
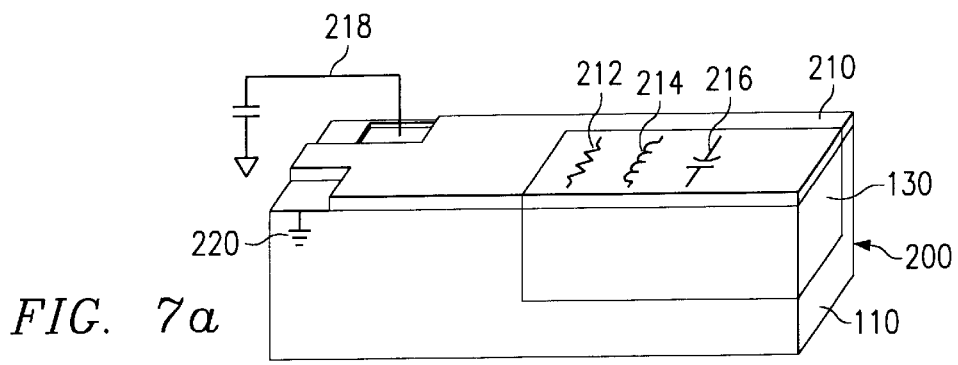
FIG. 7a is a cross sectional view of an RF Integrated Circuit motherboard with a region of porous silicon according to one embodiment.
Figure 7B:
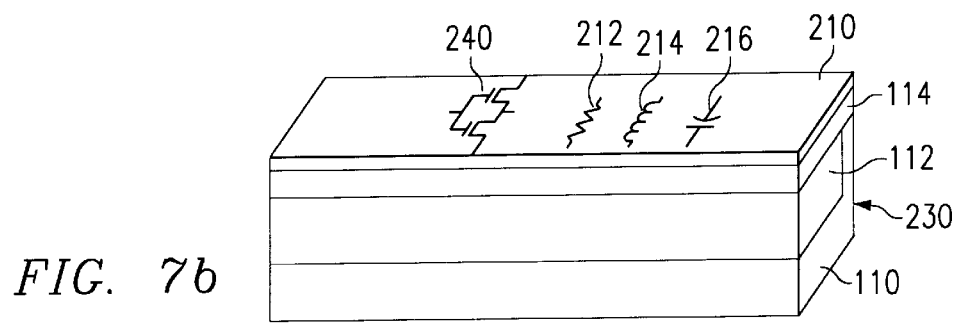
FIG. 7b is a cross sectional view of an RF chip illustration component integration with porous silicon according to one embodiment.
Figure 7C:
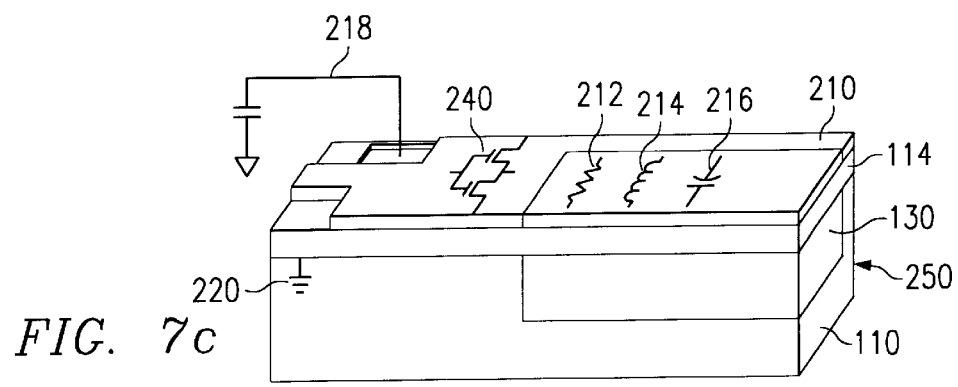
FIG. 7c is a cross sectional view of an RF chip illustration component integration with porous silicon according to yet another embodiment.

FIGS. 7a, 7b and 7c are perspective view of a motherboard, CMOS chip and hybrid circuit, respectively, using a layer of porous silicon to create a low-loss/high resistivity structure useful in RF applications. FIG. 7a depicts a RFIC motherboard 200 has the selective porous silicon region 130 created on a layer of p+ silicon substrate 110. In one embodiment, the porous silicon region 130 contains a high density of tiny vertical pores in a silicon matrix which measure approximately 100 Å. The processes used to create the porous silicon region 130 are well known to those skilled in the art.

Due to the high resistivity and low dielectric constant of the porous silicon region 130, the RFIC motherboard 200 provides a low-loss and low-crosstalk inductor 214 capacitor 216 and resistor 212 integration platform. The porous silicon region 130 retains its crystalline structure, but is largely devoid of free carriers making it a material with low thermal expansion coefficient most desirable for motherboard applications.

In one embodiment, an AC ground 218 and a DC ground 220 are attached to the p+substrate layer 110 after CVD oxide 210 or nitride passivation. Compared to commonly used fiber glass circuit boards, the RFIC motherboard 200 has the advantages of small size and low cost fabrication. It also provides a platform to integrate chips fabricated using different technologies since the anodization process can form a uniform and very thick porous silicon region (>100 $\mu$m) 130 over large-diameter silicon substrates 110. The resulting structure 200 is planar and exhibits good surface morphology suitable for downstream IC processing.

An advantage here is that by not oxidizing the porous silicon region 130, certain stress problems in the formation of the RFIC motherboard 200 are eliminated.

The RF chip 230 of FIG. 7b illustrates the integration process using conventional CMOS technology. This time, a thick porous silicon layer (>100 $\mu$m) 114 is first formed on the entire p+substrate 110, followed by growth of 2 to 3 $\mu$m of CMOS compatible epitaxial silicon 114. This epitaxial layer 114 over the porous silicon layer 114 provides a silicon wafer that is the starting material for fabrication of CMOS circuits.

As is understood by those of ordinary skill, the insertion of the porous silicon layer 112 into the p+substrate 110 is not for DC device isolation since CMOS circuits use the same device isolation as fabricated on a bulk silicon substrate 110. With>100 $\mu$m of porous silicon 112 under the thin epitaxial layer 114, the wafer 230 provides good RF isolation and low loss when passive components such as inductors 214, capacitors 216 and resistors 212 are integrated on the substrate 230. Thus, a high-quality epitaxial growth 114 on porous silicon layer 112 is an important process of the CMOS chip design of FIG. 7b.

Turning to FIG. 7c, the hybrid RFIC design 250 is shown features of the motherboard 200 and chip 230. As shown, selective porous silicon regions 130 are first formed inside a p+substrate 110. Subsequent epitaxial growth 114 results in CMOS-quality material over bulk silicon regions 110 and passive-components 212, 214, 216 over porous silicon isolation regions 130.

The primary difference between the device of FIG. 7c and that shown in FIG. 7b is that the quality requirement of the epitaxial 114 over porous silicon regions 130 is much more relaxed as it will not affect passive device (212, 214, 216) performance. In manufacturing, this approach reduces the time for material development although, it may add several process to a existing wafer fab lines.

The phrase "circuitry" comprehends ASIC (Application Specific Integrated Circuits), PAL (Programmable Array Logic), PLA (Programmable Logic Array), decoders, memories, non-software based processors, or other circuitry, or digital computers including microprocessors and microcomputers of any architecture or combinations thereof. Words of inclusion are to be interpreted as nonexhaustive in considering the scope of the invention.

Internal and external connections, communications links circuit or signal pathways can be ohmic, capacitive, direct or indirect, via intervening circuits or otherwise. Implementation is contemplated in discrete components or fully integrated circuits in silicon, gallium arsenide, or other electronic material families. It should be understood that various embodiments of the invention can employ or be embodied in hardware, software or micro coded firmware.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of providing a thick porous silicon region in a silicon substrate to increase the RF isolation properties of an integrated circuit substrate material and reduce the loss due to passive component integration induced in the substrate material, said method comprising the steps of:

providing a silicon substrate having an first surface and an opposing second surface;

defining an area within said substrate material to be anodized, forming an anodized porous silicon region in and from said area of said substrate material, said silicon region including said porous silicon region being substantially planar at said first surface of said silicon substrate and having a resistivity greater than 1000 ohm-cm;

depositing an epitaxial layer of semiconductor material on said porous silicon region; and forming at least one inductive electrical component integrated at least one of onto or into said epitaxially deposited layer of semiconductor material on said porous silicon region and electrically isolated from said silicon region.

2. The method according to claim 1 further comprising growing an epitaxial layer over said porous silicon region and said substrate material.

3. The method according to 2 further comprising the step of integrating at least one RF passive component over the portion of said epitaxial layer above said porous silicon region.

4. The method according to claim 1 wherein said porous silicon region is formed as a layer extending, over the substrate material.

5. The method according to claim 1 wherein said porous silicon region is formed to a thickness greater than 100 µm.

6. The method according to claim 1 wherein the resistivity of said porous silicon region is greater than 10 kohm-cm.

7. The method according to claim 3 further comprising the step of attaching AC and DC grounds to said substrate material.

8. A method of providing a thick porous silicon region in a silicon substrate to increase the RF isolation properties of an integrated circuit substrate material and reduce the loss due to passive component integration induced in the substrate material, said method comprising the steps of:

providing a silicon substrate of a first conductivity type having a first surface and an opposing second surface;

forming a porous silicon region having a dense array of vertical pores in a silicon matrix and occupying a portion of said first surface of said silicon substrate which is substantially planar with said first surface of said silicon substrate;

forming an epitaxial layer of the same conductivity type as said substrate over said porous silicon region; and forming at least one inductive electrical component integrated at least one of onto or into said porous silicon region about said portion opposite said second surface of said silicon substrate and electrically isolated from said silicon substrate.

9. The method of claim 8 wherein said pores are approximately 100 Å in diameter.

10. The method of claim 1 wherein said epitaxially deposited layer extends over said first surface of said silicon region and is external to said porous region.

11. The method of claim 1 wherein said epitaxially deposited layer is doped semiconductor material.

12. A method of providing a thick porous silicon region in a silicon substrate to increase the RF isolation properties of an integrated circuit substrate material and reduce the loss due to passive component integration induced in the substrate material, said method comprising the steps of:

providing a silicon substrate having a first surface and an opposing second surface;

forming a porous silicon region having a dense array of vertical pores in a silicon matrix and occupying a portion of said first surface of said silicon substrate which is substantially planar with said first surface of said silicon substrate; and forming at least one inductive electrical component integrated at least one of onto or into said porous silicon region about said portion opposite said second surface of said silicon substrate and electrically isolated from said silicon substrate;

wherein said epitaxially deposited layer is doped semiconductor material.

* * * * *